US010749543B1

(12) United States Patent
Terry

(10) Patent No.: US 10,749,543 B1
(45) Date of Patent: Aug. 18, 2020

(54) PROGRAMMABLE POLAR AND CARTESIAN RADIO FREQUENCY DIGITAL TO ANALOG CONVERTER

(71) Applicant: MORSE MICRO PTY LTD, Eveleigh (AU)

(72) Inventor: Andrew Terry, Picton (AU)

(73) Assignee: MORSE MICRO PTY LTD, Eveleigh, NSW (AU)

(*) Notice: Subject to any disclaimer, the term of this patent is extended or adjusted under 35 U.S.C. 154(b) by 0 days.

(21) Appl. No.: 16/414,327

(22) Filed: May 16, 2019

(51) Int. Cl.
*H03M 1/66* (2006.01)
*H03M 1/78* (2006.01)
*H03M 1/72* (2006.01)
*H04B 1/00* (2006.01)
*H03K 7/02* (2006.01)
*H04L 25/497* (2006.01)
*H03M 3/00* (2006.01)

(52) U.S. Cl.
CPC .......... *H03M 1/662* (2013.01); *H03M 1/661* (2013.01); *H03M 1/72* (2013.01); *H03M 1/78* (2013.01); *H03K 7/02* (2013.01); *H03M 1/66* (2013.01); *H03M 3/00* (2013.01); *H04B 1/00* (2013.01); *H04L 25/497* (2013.01)

(58) Field of Classification Search
CPC .. H03M 1/66; H03M 3/00; H03K 7/02; H04L 25/497; H04B 1/00; H03G 3/3047; H03F 2200/372

USPC ........ 341/144; 375/353, 298, 295, 244, 296, 375/348; 455/126, 341
See application file for complete search history.

(56) References Cited

U.S. PATENT DOCUMENTS

| 8,654,864 | B2* | 2/2014 | Chung ................ H04L 25/0264 375/244 |
| 2011/0028088 | A1* | 2/2011 | Avellan ............. H04B 7/18517 455/13.2 |
| 2016/0094235 | A1* | 3/2016 | Kuttner ................ H03M 1/662 |
| 2018/0261199 | A1* | 9/2018 | Kumar ............. G10K 11/17827 |

* cited by examiner

*Primary Examiner* — Joseph J Lauture
(74) *Attorney, Agent, or Firm* — Squire Patton Boggs (US) LLP

(57) ABSTRACT

A radio frequency transmitter including two digital to analog converter circuits. The two radio frequency digital to analog converter circuits are configured to operate independently or operating in unison. Operating independently includes each radio frequency digital to analog converter circuit of the two radio frequency digital to analog converter circuits receiving separate baseband signals and separate local oscillation inputs. Operating in unison includes both of the two radio frequency digital to analog converter circuits receiving a single baseband signal and a single local oscillation input. The two radio frequency digital to analog converter circuits are configured to change between operating independently and operating in unison.

21 Claims, 4 Drawing Sheets

Prior Art
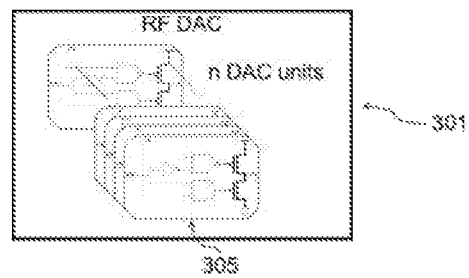
Figure 3A
Prior Art
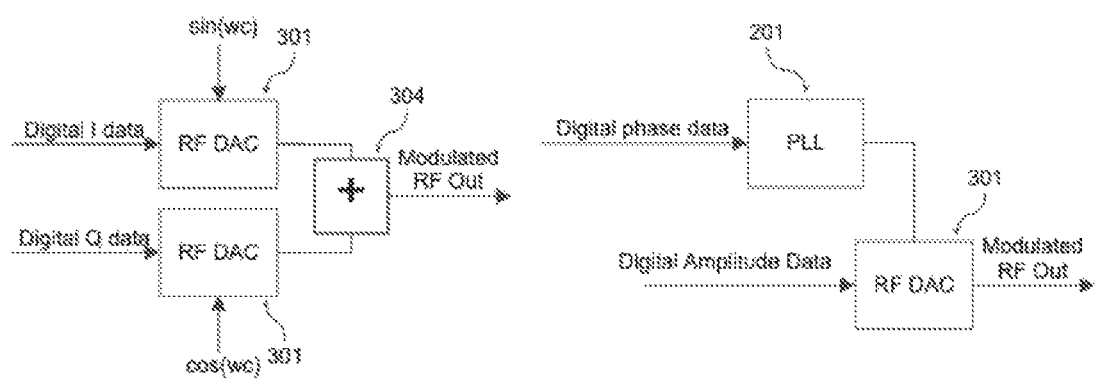
Figure 3B
Figure 3C

PROGRAMMABLE POLAR AND CARTESIAN RADIO FREQUENCY DIGITAL TO ANALOG CONVERTER

BACKGROUND

Field

Various communication systems may benefit from Radio Frequency (RF) transmitters and digital to analog converters (DAC). For example, cellular telephones, laptop computers, home entertainment equipment, RFID, and Internet of Things.

Description of the Related Art

RF transmitters are an essential component for digital wireless communications in many devices including those listed above. There are a range of protocols and standards used to define the characteristics of modulated signals. For example, many RF transmitters adhere to standards such as 3GPP LTE, IEEE 802.11, and IEEE 802.15. Modulation is the process of varying one or more properties of a periodic waveform called a carrier signal with a modulating signal that contains information to be transmitted.

SUMMARY

According to one aspect of the invention, there is provided a radio frequency transmitter comprising at least two radio frequency digital to analog converter circuits. The at least two radio frequency digital to analog converter circuits are configured to operate independently or operate in unison. The at least two radio frequency digital to analog converter circuits are configured to change between operating independently and operating in unison.

According to another aspect of the invention, there is provided a radio frequency transmitter configured to alternate between operating in a Cartesian mode and a polar mode. The radio frequency transmitter comprises a phase lock loop circuit, a first digital to analog converter circuit, and a second digital to analog converter circuit. The phase lock loop circuit is connected to the first digital to analog converter circuit and the second digital to analog converter circuit. The radio frequency transmitter also comprises a first multiplexer, a second multiplexer and a switch. The switch is disposed between the phase lock loop circuit and the second digital to analog converter circuit. The first digital to analog converter circuit is connected to the first multiplexer, and the second digital to analog converter circuit is connected to the second multiplexer.

According to another aspect of the invention, there is provided a method comprising providing a radio frequency transmitter comprising a phase lock loop circuit, a first digital to analog converter circuit, a second digital to analog converter circuit, a first multiplexer, a second multiplexer, and a switch. The method also comprises operating in a Cartesian mode, and operating in a polar mode. Operating in a Cartesian mode comprises outputting, by the phase lock loop circuit, a sine carrier output and a cosine carrier output. The Cartesian mode can also comprise passing, by the switch, the cosine carrier output, and receiving, by the first digital to analog converter circuit, a first digital signal. The Cartesian mode can also comprise receiving, by the second digital to analog converter circuit, and a second digital signal. Operating in a polar mode comprises outputting, by the phase lock loop circuit, output determined by a digital phase data input. The polar mode also comprises passing, by the switch, the sine carrier output, and outputting, by the first digital multiplexer and second digital multiplexer, and a digital amplitude signal.

BRIEF DESCRIPTION OF THE DRAWINGS

For proper understanding of the invention, reference should be made to the accompanying drawings, wherein:

FIG. 3A illustrates a RF DAC according to the prior art.

FIG. 3B illustrates a Cartesian transmitter according to the prior art.

FIG. 3C illustrates a polar transmitter according to the prior art.

DETAILED DESCRIPTION

Figure 1:
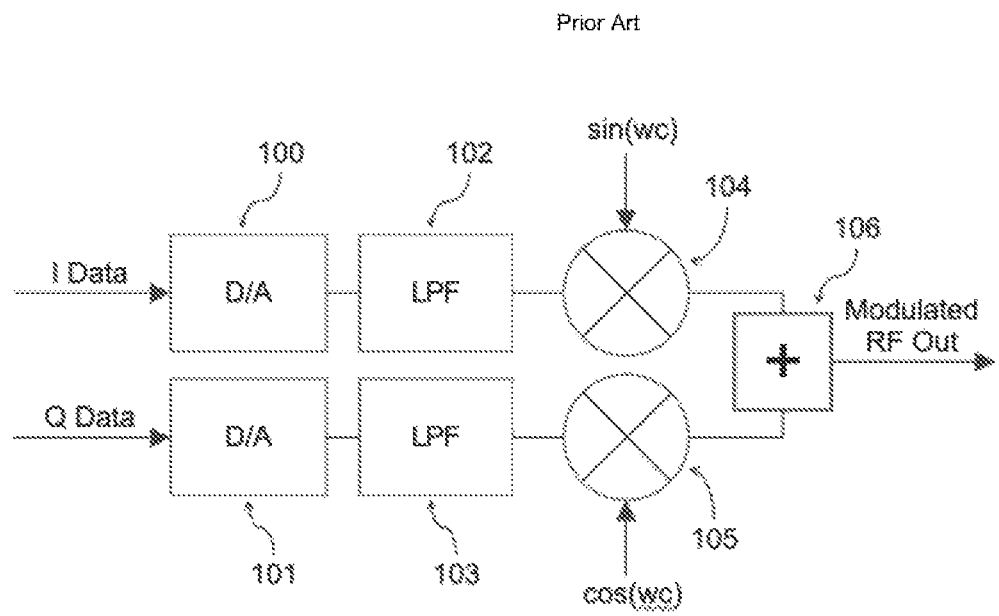
FIG. 1 illustrates a Cartesian transmitter according to the prior art.

Two types of modulation are polar and Cartesian. Transmitters of both polar and Cartesian modulation have different characteristics, which can be advantageous in certain situations. For example, a transmitter using polar modulation, sometimes called a polar transmitter, can be more efficient in certain configurations than a transmitter using Cartesian modulation, because non-linear amplification can be used in the Power Amplifier (PA), and power is not lost in a summation block. Alternatively, a transmitter using Cartesian modulation, sometimes called a Cartesian transmitter, may be better able to create higher fidelity signals than a polar transmitter because of the smaller bandwidth requirements in the phase modulated RF signal. A problem faced by the prior art is that transmitters have been limited to either polar modulation or Cartesian modulation. Therefore, there exists a need to for a transmitter capable of polar modulation and Cartesian modulation.

Certain embodiments of the invention provide a radio transmitter that can operate using either Cartesian modulation or polar modulation, under software control. For high bandwidth and/or high fidelity scenarios, the transmitter can operate using Cartesian modulation, while, polar modulation can be used for low bandwidth and low fidelity scenarios.

In order to transmit digital information, a radio frequency (RF) carrier or local oscillator (LO) is modulated with a signal containing the digital data. There are many different modulation schemes which can be used. Some modulation schemes provide a constant envelope in which information is contained only in the phase (e.g., Frequency Shift Keying (FSK) and Binary Phase Shift Keying (BPSK)).

Alternatively, some modulation schemes provide a non-constant envelope in which information may also be contained in the phase and amplitude. Non-constant envelope modulation schemes may provide higher spectral efficiency. For example, a Quadrature Amplitude Modulation (QAM) scheme encodes data in both the phase and amplitude, which allows for increased spectral efficiency when compared to a constant envelope scheme.

Orthogonal Frequency Domain Modulation (OFDM) is another example of a non-constant envelope scheme in which data is encoded onto multiple sub-carriers, and the sub-carriers are modulated with, for example, BPSK or QAM. It is worth noting that even if the sub-carriers are modulated with a constant amplitude modulation scheme the complete OFDM signal will not be constant envelope. OFDM is used in many protocols due to its high level of spectral efficiency and tolerance to multipath, such as IEEE 802.11ah and 3GPP LTE.

Adaptive rate algorithms may be utilized to increase the modulation complexity in order to achieve higher data rates; however, radio channel conditions may inhibit their use. For example, in IEEE 802.11ac, QAM may be used when a low noise radio channel exists, and devices can be configured to automatically switch to a more robust modulation scheme, such as BPSK, if the radio channel deteriorates.

Radio transmitter performance is typically measured and specified by Error Vector Magnitude (EVM). The EVM specification for a transmission utilizing a high bandwidth modulation is usually more stringent than the EVM specification for a transmission utilizing a low bandwidth modulation scheme. Thus, the same radio transmitter can be required to perform with high fidelity to achieve a high EVM during a high data rate transmission, and be permitted to perform with a lower EVM, when a lower data rate transmission is used.

Non-constant envelope signals may be generated by Cartesian summation of two up-converted signals. One of the two up-converted signals may be in-phase (I), and the other up-converted signal may be quadrature-phase (Q).

Equation (1) expresses the generation of a non-constant envelop signal by Cartesian summation, where I(t) is the in-phase signal, Q(t) is the quadrature signal, and we is the RF carrier frequency, or LO.

$$v(t)=I(t)\sin(\omega c*t)+Q(t)\sin(\omega c*t) \quad (1)$$

The same RF signal can be generated by multiplying a phase modulated constant envelope signal with an amplitude signal, as expressed in equation (2).

In equation (2), A(t) is the amplitude, and et is the phase of the RF carrier.

$$v(t)=A(t)\cos(\omega c*t+\theta t) \quad (2)$$

FIG. 1 illustrates a Cartesian transmitter. A Cartesian transmitter may include of a pair of Digital to Analog Converters (DAC) 100, 101. The DACs 100, 101 receive the I and Q phase signals. The I and Q signals are then output from the DACs 100, 101 to low pass filters 102, 103. Mixers 104, 105 up-convert the I and Q signals to the RF carrier frequency. The I signal is mixed with a sine wave RF carrier and the Q signal is mixed with a cosine wave RF carrier. The summer 106 adds the outputs of the mixers 104, 105 to produce a modulated RF output.

Figure 2:
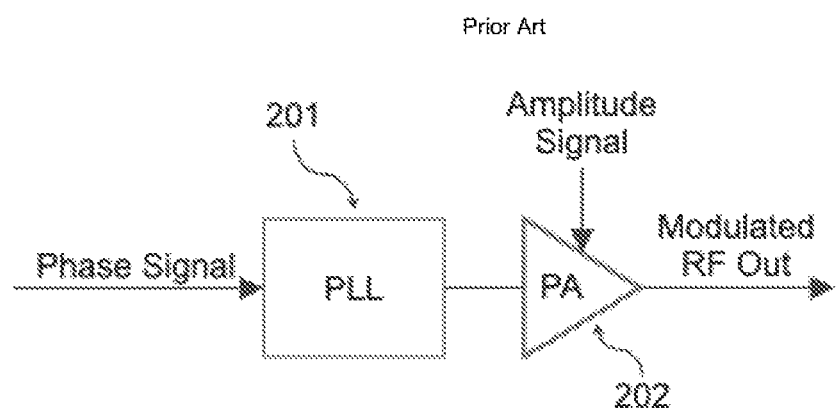
FIG. 2 illustrates a polar transmitter according to the prior art.

FIG. 2 illustrates a polar transmitter. Phase Lock Loop (PLL) circuit 201 produces a RF signal based on the carrier (ωc) and the phase is controlled by the input phase signal. RF PA 202 amplifies the signal from PLL circuit 201. The gain is controlled by the amplitude signal.

A polar transmitter may include a RF PA 202 with output which can be controlled by a digital signal. The phase of the RF signal can be controlled digitally. The phase modulation of the RF signal may be achieved by a PLL circuit 201 which is specifically designed to be capable of producing a phase modulated output signal that is controllable by a digital code, rather than a single tone RF signal.

The PLL loop bandwidth for the phase modulation is typically at least five times greater than that of the modulation bandwidth of the desired RF output signal. The construction of such a phase modulating PLL circuit 201 can be difficult and power consuming, particularly for RF signals occupying a large bandwidth. However, polar transmitters may still be advantageous because PA 202 can be operated in its non-linear region resulting in increased power efficiency.

Advancements in semiconductor fabrication processes have yielded a DAC with integrated mixer functionality, known as a RF DAC. FIG. 3A illustrates an embodiment of a RF DAC 301. Certain embodiments of RF DACs 301 include using a number, n, of DAC units 305. When DAC units 305 are enabled by inputting a logic on its data input, the DAC unit 305 may switch NMOS transistors and PMOS transistors on and off as determined by the LO input. Switching the NMOS and PMOS transistors on and off drives an RF signal from the output port of the DAC305. The frequency of the RF signal may be equal to the frequency of the LO.

Several DAC units 305 can be controlled by a common LO input and different data inputs. Together, the common LO input and different data inputs, create a circuit configured to digitally control the amplitude of the RF output signal through the several different data inputs.

In some embodiments, the RF DAC 301 may include current sources, while in other embodiments the RF DAC 301 may include switch capacitors providing switched capacitance, as DAC elements. Other implementations of RF DACs 301 are possible.

FIGS. 3B and 3C illustrate embodiments of a Cartesian transmitter and a polar transmitter, respectively. In both FIGS. 3B and 3C, the transmitters comprise RF DACs 301. FIG. 3B further includes a summer 304. I and Q RF DAC outputs can be added in the summer 304 to produce a dual side band RF output. However, half the power may be lost in the summation of the RF I and Q signals.

RF DACs 301 may also be used as part of a polar transmitter. A single RF DAC 301 with high output power may act as the RF PA in a polar transmitter and the RF modulating signal is phase modulated. As described above, the polar transmitter provides an advantage over a Cartesian transmitter because more output power can be supplied while using less power from the supply. The polar configuration does not suffer the 50% loss of power in the summation of I and Q signals like a Cartesian transmitter. Additionally, the maximum output power can be higher. Thus, four times the power can be delivered to the load while only requiring twice the power from the supply. A disadvantage of a polar transmitter, with respect to a Cartesian transmitter, is that the phase modulation of the RF signal presents implementation challenges. While other implementations are possible, FIG. 3C illustrates one possibility.

Figure 4:
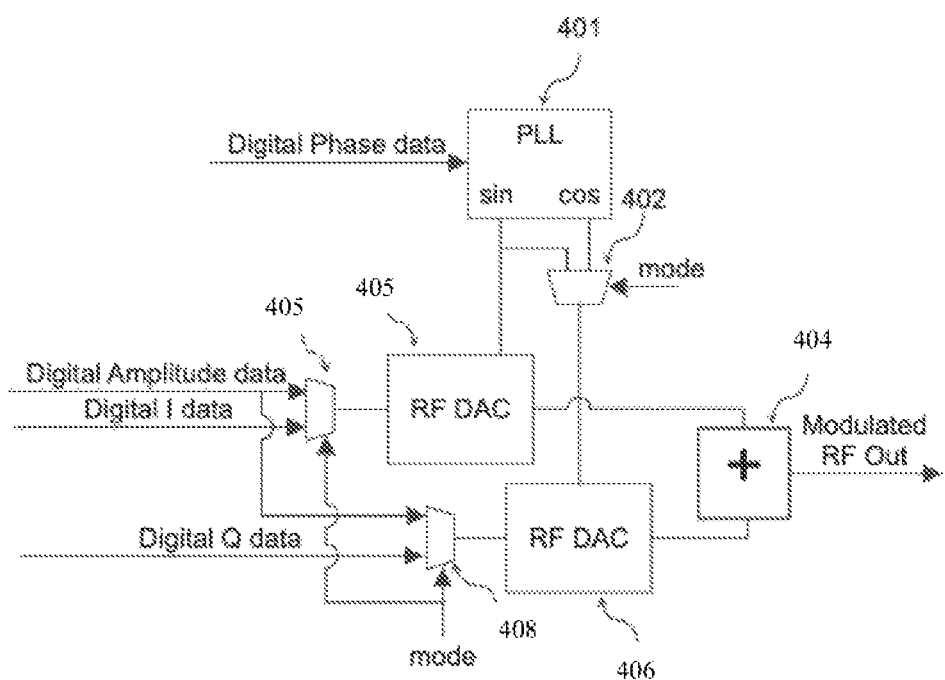
FIG. 4 illustrates a RF transmitter according to an embodiment of the invention.

FIG. 4 illustrates an embodiment of an RF transmitter according to certain embodiments of the invention. The RF transmitter is configured to operate using either Cartesian modulation or polar modulation.

While operating using Cartesian modulation, sometimes called Cartesian mode, the RF transmitter may be configured so that two RF DACs 405, 406 operate independently by receiving an independent digital I signal and an independent digital Q signal. Multiplexer 402 passes the cosine output from the PLL circuit 401 to the RF DAC 406. The PLL circuit 401 is configured to provide a constant phase output. The RF DAC 405 uses a sine wave LO and RF DAC 406 uses a cosine LO. Multiplexers 407, 408 select the digital I and Q signals to pass to RF DACs 405, 406. The outputs of the two RF DACs 405, 406 are summed at summer 404 to produce a dual sideband modulated RF output.

The RF transmitter of FIG. 4 can also operate using polar modulation, sometimes called polar mode, in which the transmitter may be configured such that the two RF DACs 405, 406 operate in unison. The RF DACs 405, 406 synchronously create a single RF DAC, with twice the number of elements than the Cartesian mode. In the polar mode of operation, both RF DACs 405, 406 utilize the same RF carrier or LO. Multiplexer 402 selects the sine wave signal from the PLL circuit 401 for both of the RF DACs 405, 406. This allows the two RF DACs 405, 406 to operate utilizing the same phase modulated RF carrier and the same digital data. The RF modulated output is generated by summing two identical signals, which are both phase and amplitude modulated.

The PLL circuit 401 can output a sine and cosine fixed phase carrier, but the PLL circuit 401 can also modulate the phase as its output according to the Phase Signal input. A multiplexer 402, or switch 402, may be configured to select the sine or cosine output of the PLL circuit 401 used as the LO for the second RF DAC 406. Multiplexers 407, 408 may select either Cartesian Digital I and Q data signals to be used as the amplitude data for the RF DACs 405, 406, or the amplitude signal.

In another embodiment, the sine and cosine outputs from the PLL circuit 401 may be generated in separate circuits outside of the PLL 401.

In some embodiments, the RF modulating signal may be phase modulated so that a dual sideband modulated RF output signal is produced. When operated in unison, constant envelope modulation schemes may be achieved by fixing the baseband signal while providing a phase modulated LO.

In certain embodiments the RF transmitter may have DACs that are single ended, for example, FIG. 4. Single ended transmission uses one wire to carry a voltage that represents the signal, and another wire connected to a reference voltage. Single ended implementations allow for simplicity while also being capable of transmitting multiple signals.

Other embodiments may have a differential implementation. A differential implementation uses two complementary signals to transmit information. The DAC may output a differential signal.

Figure 5:
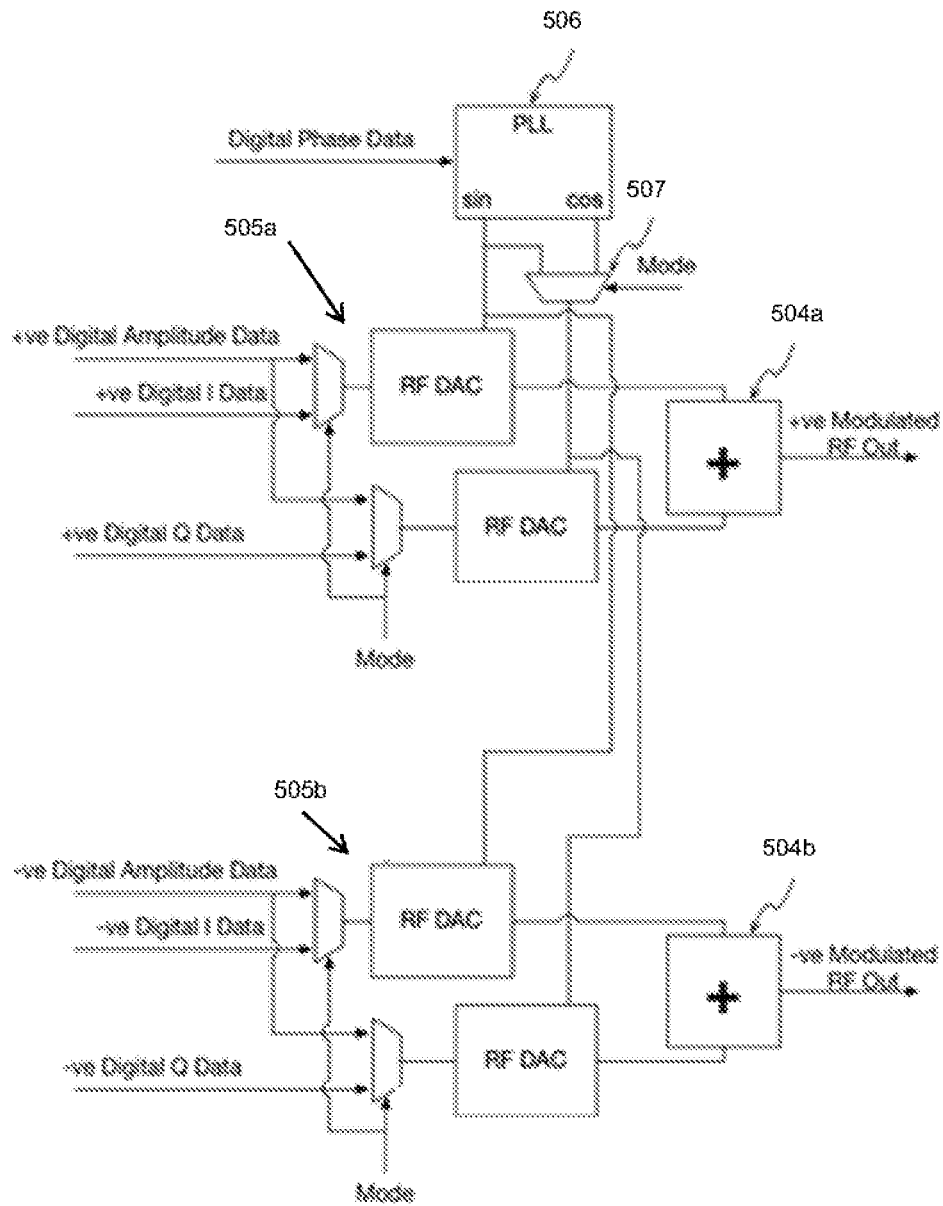
FIG. 5 illustrates a RF transmitter according to an embodiment of the invention.

FIG. 5 illustrates an embodiment of an RF transmitter according to certain embodiments of the invention Similar to FIG. 4, the RF transmitter is configured to operate using either Cartesian modulation or polar modulation and the DAC outputs 504a and 504b produce differential signals. The RF transmitter includes the upper DAC 505a and the lower DAC 505b. Both the upper and the lower DAC may use the same PLL 506 and multiplexer 507.

In the polar mode, the upper DAC 505a may receive a +ve digital amplitude and the lower DAC 505b may receive a −ve digital amplitude.

In the Cartesian mode, the upper DAC 505a may receive a +ve digital I and Q data, and the lower DAC 505b may receive a −ve digital I and Q data. The −ve and +ve of the digital amplitude data and the digital I and Q data function to make the two output signals compliments of each other.

In certain embodiments the DAC may include class G elements.

It is to be understood that the above description is illustrative of the invention and is not to be construed as limiting the invention. Various modification, applications and/or combinations of the embodiments may occur to those skilled in the art without departing from the scope of the invention as defined by the claims.

On having ordinary skill in the art will readily understand that the invention as discussed above may be practiced with hardware elements in configurations which are different than those which are disclosed. Therefore, although the invention has been described based upon these preferred embodiments, it would be apparent to those skilled in the art that certain modifications, variations, and alternative constructions would be apparent, while remaining within the scope of the invention.

Listing of Abbreviations

RF Radio Frequency
LO Local Oscillator
FSK Frequency Shift Keying
BPSK Binary Phase Shift Keying
QAM Quadrature Amplitude Modulation
OFDM Orthogonal Frequency Domain Modulation
EVM Error Vector Magnitude
I In-phase
Q Quadrature-phase
PA Power Amplifier
PLL Phase Lock Loop
DAC Digital to Analog Converter
RF DAC Radio Frequency Digital to Analog Converter

I claim:

1. A radio frequency transmitter, comprising:
at least two radio frequency digital to analog circuits configured to operate independently or operate in unison, wherein
when the at least two digital to analog circuits are configured to operate in unison, both of the at least two digital to analog circuits receive a single local oscillation input from a single output of a phase lock loop circuit; and
when the at least two digital to analog circuits are configured to operate independently, each of the at least two digital to analog circuits receives separate local oscillation inputs from separate outputs of the phase lock loop circuit.

2. The apparatus of claim 1, further comprising: wherein the radio frequency transmitter is configured to produce constant envelope modulated signals.

3. The radio frequency transmitter of claim 1, wherein the single local oscillation input and the separate local oscillation inputs are determined by a multiplexer.

4. The radio frequency transmitter of claim 1, wherein the single local oscillation input comprises a sine output wave, and the separate local oscillation inputs comprise the sine output wave and a cosine output wave.

5. The radio frequency transmitter of claim 3, wherein the sine output wave and cosine output wave are configured to be generated in separate circuits outside of the phase lock loop circuit.

6. The radio frequency transmitter of claim 1, wherein the at least two radio frequency digital to analog circuits comprise switch capacitor circuits.

7. The radio frequency transmitter of claim 1, wherein the at least two radio frequency digital to analog circuits comprise current source circuits.

8. The radio frequency transmitter of claim 1, wherein the at least two radio frequency digital to analog circuits are single ended.

9. The radio frequency transmitter of claim 1, wherein the at least two radio frequency digital to analog circuits output a differential signal.

10. The radio frequency transmitter of claim 1, wherein the two radio frequency digital to analog circuits comprise class G elements.

11. A radio frequency transmitter, comprising:
a phase lock loop circuit;
a first digital to analog converter circuit;
a second digital to analog converter circuit, wherein
the phase lock loop circuit is connected to the first digital to analog converter circuit and the second digital to analog converter circuit;
a switch, wherein
the switch is disposed between the phase lock loop circuit and the second digital to analog converter circuit;
a first multiplexer; and
a second multiplexer, wherein
the first digital to analog converter circuit is connected to the first multiplexer, and the second digital to analog converter circuit is connected to the second multiplexer; and
the radio frequency transmitter is configured to alternate between operating in a Cartesian mode and a polar mode.

12. The radio frequency transmitter of claim 11, wherein the first digital to analog converter circuit and the second digital to analog converter circuit comprise radio frequency digital to analog circuits.

13. The radio frequency transmitter of claim 11, wherein the radio frequency transmitter is configured to produce constant envelope modulated signals.

14. The radio frequency transmitter of claim 11, wherein the phase lock loop circuit is configured to output a sine carrier output and a cosine carrier output, wherein the sine carrier output and the cosine carrier output are configured to be generated in separate circuits outside of the phase lock loop.

15. The radio frequency transmitter of claim 11, wherein the first digital to analog converter circuit and the second digital to analog converter circuit comprise current source circuits.

16. The radio frequency transmitter of claim 11, wherein the first digital to analog converter circuit and the second digital to analog converter circuit comprise switch capacitor circuits.

17. The radio frequency transmitter of claim 11, wherein the first digital to analog converter circuit and the second digital to analog converter circuit are single ended.

18. The radio frequency transmitter of claim 11, wherein the first digital to analog converter circuit and the second digital to analog converter circuit output a differential signal.

19. The radio frequency transmitter of claim 11, wherein the first digital to analog converter circuit and the second digital to analog converter circuit comprise class G elements.

20. The radio frequency transmitter of claim 11, wherein the switch is a multiplexer.

21. A method comprising:
providing a radio frequency transmitter comprising a phase lock loop circuit, a first digital to analog converter circuit, a second digital to analog converter circuit, a first multiplexer, a second multiplexer, and a switch;
operating the radio frequency transmitter in a Cartesian mode comprising
outputting, by the phase lock loop circuit, a sine carrier output and a cosine carrier output,
passing, by the switch, the cosine carrier output,
receiving, by the first digital to analog converter circuit, a first digital signal, and
receiving, by the second digital to analog converter circuit, a second digital signal; and
operating the radio frequency transmitter in a polar mode comprising
outputting, by the phase lock loop circuit, output determined by a digital phase data input,
passing, by the switch, the sine carrier output, and
outputting, by the first digital multiplexer and second digital multiplexer, a digital amplitude signal.

* * * * *